United States Patent
Lee

(10) Patent No.: US 8,731,217 B2
(45) Date of Patent: May 20, 2014

(54) METHOD AND APPARATUS FOR CONTROLLING AUDIO SIGNAL OUTPUT LEVEL OF PORTABLE AUDIO DEVICE

(75) Inventor: Jun-tae Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1416 days.

(21) Appl. No.: 11/843,061

(22) Filed: Aug. 22, 2007

(65) Prior Publication Data

US 2008/0192959 A1    Aug. 14, 2008

(30) Foreign Application Priority Data

Feb. 14, 2007    (KR) .................. 10-2007-0015534

(51) Int. Cl.
H03G 7/00    (2006.01)

(52) U.S. Cl.
USPC ........................................... 381/106

(58) Field of Classification Search
CPC ...................................... H03G 7/00
USPC ............. 381/312, 322, 102–109, 321; 700/94
See application file for complete search history.

(56) References Cited

U.S. PATENT DOCUMENTS

| | | | |
|---|---|---|---|
| 4,704,727 A * | 11/1987 | Beard ............................. | 381/13 |
| 5,396,562 A * | 3/1995 | Ishimitsu et al. ............. | 381/107 |
| 5,526,419 A * | 6/1996 | Allen et al. .................... | 379/391 |
| 5,631,968 A * | 5/1997 | Frey et al. ...................... | 381/106 |
| 5,892,834 A * | 4/1999 | Smart et al. .................... | 381/106 |
| 7,110,559 B2 * | 9/2006 | Behboodian et al. ......... | 381/106 |
| 7,242,784 B2 * | 7/2007 | Cranfill et al. ................ | 381/107 |
| 7,848,531 B1 * | 12/2010 | Vickers et al. ................ | 381/107 |
| 2003/0123680 A1 | 7/2003 | Lee et al. | |
| 2005/0100179 A1 | 5/2005 | Behboodian et al. | |
| 2008/0069385 A1 * | 3/2008 | Revit ............................. | 381/321 |
| 2008/0095385 A1 * | 4/2008 | Tourwe ......................... | 381/107 |

FOREIGN PATENT DOCUMENTS

| | | |
|---|---|---|
| CN | 1879297 A | 12/2006 |
| EP | 1729410 | 12/2006 |
| KR | 10-2005-0082510 A | 8/2005 |
| WO | WO 2005/074129 | 8/2005 |

OTHER PUBLICATIONS

Vickers, "Automatic Long-Term Loudness and Dynamics Matching", Audio Engineering Society 111.sup.th Convention, Sep. 21-24, 2001.*
Office Action issued in corresponding European Patent Application No. 07120566.0 dated Jun. 3, 2008.

* cited by examiner

Primary Examiner — Duc Nguyen
Assistant Examiner — Kile Blair
(74) Attorney, Agent, or Firm — Jefferson IP Law, LLP

(57) ABSTRACT

An audio signal output level control method used in an audio device includes detecting input levels of an audio signal, determining control modes to be applied to the audio signal based on the input levels of the audio signal, controlling the input levels of the audio signal according to the control modes, and determining output levels corresponding to the controlled input levels.

39 Claims, 7 Drawing Sheets

METHOD AND APPARATUS FOR CONTROLLING AUDIO SIGNAL OUTPUT LEVEL OF PORTABLE AUDIO DEVICE

CROSS-REFERENCE TO RELATED APPLICATION

This application claims the benefit of Korean Application No. 2007-15534, filed Feb. 14, 2007 in the Korean Intellectual Property Office, the disclosure of which is incorporated herein by reference.

BACKGROUND OF THE INVENTION

1. Field of the Invention

Aspects of the present invention relate to a method and apparatus to control an audio signal output level, and more particularly, to a method and apparatus to control an audio signal output level of a portable audio device.

2. Description of the Related Art

People frequently listen to music using various types of audio devices. In particular, portable audio reproducing devices, such as MP3 players, mobile phones having a music reproduction function, etc., which store hundreds to thousands of music tracks, have recently become popular. As a result, many people are listening to music using such portable audio reproducing devices.

Music stored in portable audio reproducing devices does not have the same level as recorded audio signals. Specifically, some music files can include high level audio signals, and other music files can include low level audio signals. Music including the high level audio signals produce loud sound, and music including the low level audio signals produce soft sound. In this regard, music including extremely low level audio signals does not produce a sufficient volume of sound even if the volume is turned up. This insufficient volume degrades the listening environment.

Portable audio reproducing devices have embedded batteries to supply voltage for portable terminals. As time elapses, the battery voltage for portable terminals is reduced. As the voltage supplied by the battery decreases, the volume level of the audio signal decreases. As a result, reproduced music sound becomes softer, resulting in a poor listening environment. Conventionally, when a low volume level audio signal is input or a battery supplies a lower voltage to a portable terminal, a reproduced music sound becomes softer, creating a poor listening environment.

SUMMARY OF THE INVENTION

Aspects of the present invention provide an audio signal output level control method and apparatus for a portable audio device so that an audio signal input with a low volume level or an audio signal output with a low volume level due to a limited voltage level is output with a high volume level.

An aspect of the present invention provides an audio signal output level control method to be used in an audio device, including detecting input levels of an audio signal, determining control modes to be applied to the audio signal based on the input levels of the audio signal, controlling the input levels of the audio signal according to the control modes, and determining output levels corresponding to the input levels.

According to an aspect, the method further includes dividing the audio signal into a plurality of processing sections based on a predetermined period of time or a predetermined number of samples, and calculating an average value of the input levels of the audio signal included in the processing sections for each of the processing sections, wherein the control modes to be applied to the audio signal included in each of the processing sections are determined based on the average values of the input levels in each of the processing sections.

According to an aspect, the determining of the output levels includes increasing a lowest input level among the input levels of the audio signal by a predetermined level, determining the increased input level as a minimum output level, determining a highest input level among the input levels as a maximum output level, and determining the output levels between the minimum output level and the maximum output level using level inclinations obtained by determining the differences between increases in the input levels and corresponding increases in the output levels.

According to an aspect, the determining of the output levels further includes dividing the input levels into a first section where the input levels are less than a first threshold, a second section where the input levels are between the first threshold and a second threshold, and a third section where the input levels are more than the second threshold; controlling the input levels included in each of the processing sections using the different level inclinations, and determining the output levels based on the controlled input levels.

According to an aspect, the input levels of the audio signal included in the second and third sections are respectively controlled using a level inclination which is lower than another level inclination used to control the input levels of the audio signal included in the first section and then output as the output levels, based on a first control mode applied to the audio signal when the average value of the input levels is less than the first threshold.

According to an aspect, the input levels of the audio signal included in the third section are controlled using one of the two level inclinations which is lower than the other of the two level inclinations used to control the input levels of the audio signal included in the second section, and then output as the output levels.

According to an aspect, the input levels of the audio signal included in the first and third sections are respectively controlled using two of the level inclinations which are lower than another of the level inclinations used to control the input levels of the audio signal included in the second section and then output as the output levels, based on a second control mode applied to the audio signal when the average value of the input levels is between the first threshold and the second threshold.

According to an aspect, the input levels of the audio signal included in the first and second sections are respectively controlled using a level inclination which is lower than another of the level inclinations which is used to control the input levels of the audio signal included in the third section and then output as the output levels, based on a third control mode applied to the audio signal when the average value of the input levels is more than the second threshold.

According to an aspect, the input levels of the audio signal included in the first section are controlled using one of the two level inclinations which is lower than the other of the two level inclinations used to control the input levels of the audio signal included in the second section and the output as the output levels.

According to an aspect, the detecting of the input levels of the audio signal includes detecting a level of a voltage supplied by the audio device, and the determining of the output levels further includes increasing the output levels by a predetermined level based on the detected voltage, and determining the output levels as final output levels.

According to an aspect, the determining of the output levels further includes controlling the input levels using a database which stores the output levels which are determined after the input levels of the audio signal are controlled according to the control modes and determining the output levels based on the stored output levels.

Another aspect of the present invention provides an audio signal output level control apparatus of a portable audio device, including a level detector to detect input levels of an audio signal, a control mode determiner to determine control modes to be applied to the audio signal based on the input levels of the audio signal, and an output level determiner to control the input levels of the audio signal according to the control modes and to determine output levels corresponding to the controlled input levels.

According to another aspect, the apparatus further includes a section divider to divide the audio signal into a plurality of processing sections according to a predetermined period of time or a predetermined number of samples, and an average calculator to calculate an average value of the input levels of the audio signal included in each of the processing sections, wherein the control mode determiner determines the control modes applied to the audio signal included in each of the processing sections based on the average values of the input levels in each of the processing sections.

Yet another aspect of the present invention provides a computer readable recording medium encoded with a computer readable program with processing instructions for executing an audio signal output level control method to be used in an audio device, the method including detecting input levels of an audio signal, determining control modes to be applied to the audio signal based on the input levels of the audio signal, controlling the input levels of the audio signal according to the control modes and determining output levels corresponding to the input levels.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
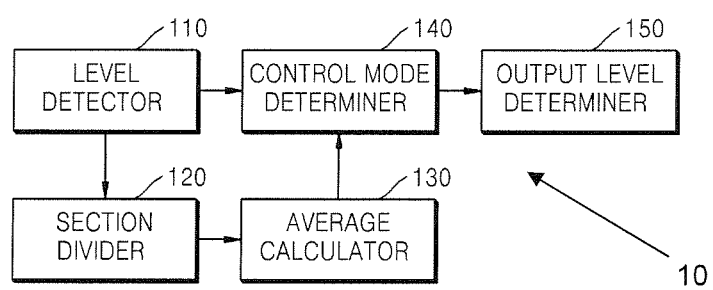
FIG. 1 is a block diagram of an audio signal output level control apparatus of a portable audio device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a block diagram of an audio signal output level control apparatus 10 to be used with a portable audio device according to an embodiment of the present invention. Referring to FIG. 1, the audio signal output level control device 10 to be used with the portable audio device includes a level detector 110, a section divider 120, an average calculator 130, a control mode determiner 140, and an output level determiner 150. It is understood that the audio signal output level control apparatus 10 is not limited to being used in a portable audio device, and may instead be used in non-portable or semi-portable audio devices as well, such as mini-stereos, etc.

The level detector 110 detects an input level of an audio signal. The audio signal can be a digital or analog signal. The level detector 110 also detects the level of a voltage supplied by the audio device (not shown). When the level detector 110 detects the level of the voltage, the output level determiner 150 can determine an output level.

The section divider 120 divides the audio signal into a plurality of processing sections according to a predetermined period of time, a predetermined number of samples, or according to some other criteria. It is understood that the section divider 120 can divide the audio signal according to many different types of criteria, such as by tracks, by groups of tracks, by seconds, by minutes, etc.

Figure 2:
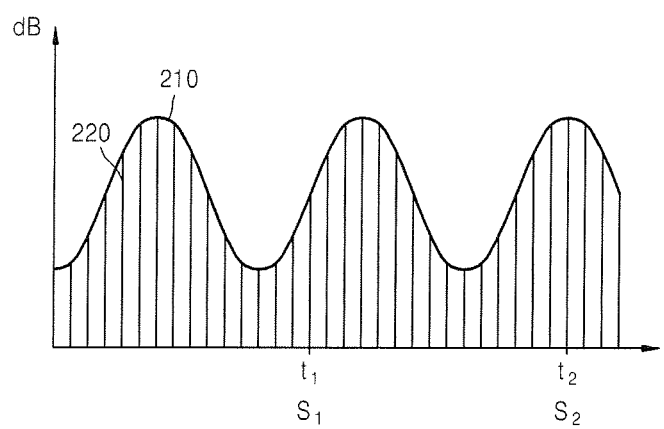
FIG. 2 is a graph illustrating the operation of a section separator illustrated in FIG. 1.

FIG. 2 is a graph illustrating an operation of the section divider 120 illustrated in FIG. 1. Referring to FIG. 2, when the audio signal is an analog signal 210, the section divider 120 divides the analog signal 210 into $t_1$ and $t_2$ according to a predetermined period of time. When the audio signal is a digital signal 220, the section divider 120 divides the digital signal 220 into $s_1$ and $s_2$ according to a predetermined number of samples. According to an aspect of the present invention, the predetermined period of time used to divide the audio signal 210 is 0.01 seconds, and the predetermined number of samples used to divide the digital signal 220 is 440. However, it is understood that the predetermined period of time can be more or less than 0.01 seconds and is not limited to being one time period, and that the predetermined number of samples can be more or less than 440 and is not limited to being one number.

The section divider 220 divides the audio signal 210 into smaller processing sections because the operation of outputting a larger audio signal which is completely processed, i.e., an undivided audio signal 210, takes a long time to output. For example, if the audio signal 210 is processed as a whole, it is possible to output the completely processed audio signal 210. However, if another audio signal is previously input, the audio signal 210 can be completely processed only after the previously input audio signal is completely processed. However, the section divider 220 is not required in all aspects of the present invention.

The average calculator 130 calculates an average value of input levels included in the processing sections of the audio signal 210 divided by the section divider 120. Alternatively, if the section divider 120 is not used, the average calculator 130 calculates an average value of input levels of the whole audio signal 210 if the audio signal 210 is not divided into sections.

Otherwise, the average calculator 130 calculates individual averages of the processing sections.

The control mode determiner 140 determines a control mode to be applied to the audio signal 120 based on an input level of the audio signal 210 determined by the level detector 110. The control mode determiner 140 determines the control mode to be applied to the audio signal 210 based on the whole audio signal 210 if the audio signal is not divided into processing sections or the average value of the input levels of the audio signal 210 included in the processing sections if the audio signal 210 is divided into processing sections. More specifically, the control mode determiner 140 selects different control modes when the average value of the input levels of the audio signal 210 is less than a first threshold, is between the first threshold and a second threshold, and is greater than the second threshold, i.e., if a recording level of the audio signal 210 is low, middle, and high in regard to signal intensity. It is understood that the control mode determiner 140 can set one or more than two thresholds.

When the recording level of the audio signal 210 is low, the control mode determiner 130 applies a first control mode to the audio signal 210. If the recording level of the audio signal 210 is at a middle level, the control mode determiner 130 applies a second control mode to the audio signal 210. If the recording level of the audio signal 210 is high, the control mode determiner 130 applies a third mode to the audio signal. It is understood that the control mode determiner 140 is not limited to applying control modes based on three levels, and may instead apply control modes based on more or less than three levels.

Level inclinations used to control the input levels vary according to each control mode. Each level inclination corresponds to an increase of each output level according to an increase of each input level. The level inclinations, the first control mode, the second control mode, and the third control mode will be described in detail with reference to the output level determiner 150. Each control mode is divided into sections according to the input levels of the audio signal 210 and is designed to control the input levels using the different level inclinations corresponding to the sections. The sections which are created according to the input levels (FIG. 3) are not the same as the processing sections (FIG. 2).

Figure 3:
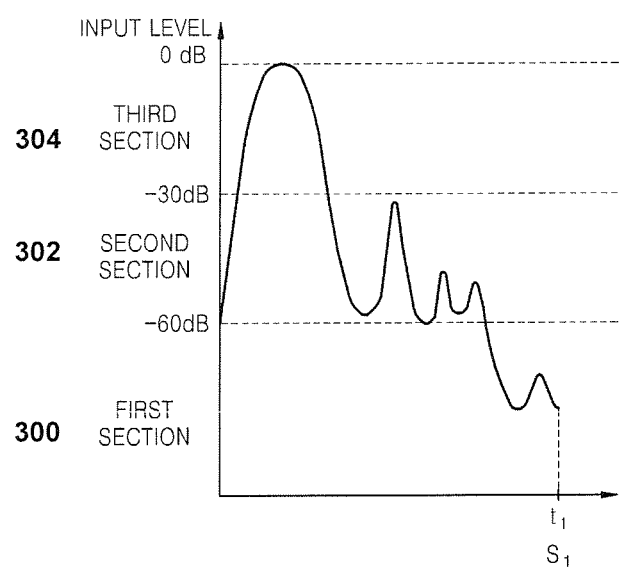
FIG. 3 is a graph illustrating sections of input levels to control the input levels according to an embodiment of the present invention.

FIG. 3 is a graph illustrating sections of the input levels to control the input levels according to an embodiment of the present invention. Referring to FIG. 3, an x-axis indicates time, and a y-axis indicates low and high levels of the audio signal 210. The audio signal 210 is divided into sections up to $t_1$ on the time axis.

The input levels of the audio signal 210 are divided into a first section 300, a second section 302, and a third section 304 based on a first dB threshold and a second dB threshold during a first processing section from 0 to t1 (FIG. 2). For example, the first threshold and the second threshold can be respectively set to −60 db and −30 db. However, aspects of the present invention are not limited thereto. Furthermore, it is understood that the graph shown in FIG. 3 is only one example of an audio analog signal, and that many other waveforms may instead be used according to other aspects of the present invention.

The first section 300 includes the audio signal 210 having a low input level. The second section 302 includes the audio signal 210 having a middle input level. The third section 304 includes the audio signal 210 having a high input level.

The input levels of the audio signal 210 included in the first through third sections 300, 302, and 304 are controlled using different level inclinations, so that the audio signal is divided into the sections 300, 302, and 304 according to the input levels. The output level determiner 150 controls the input levels of the audio signal 210 according to the control mode determined by the control mode determiner 140 and determines the output level of the audio signal based on the input levels.

Figure 4:
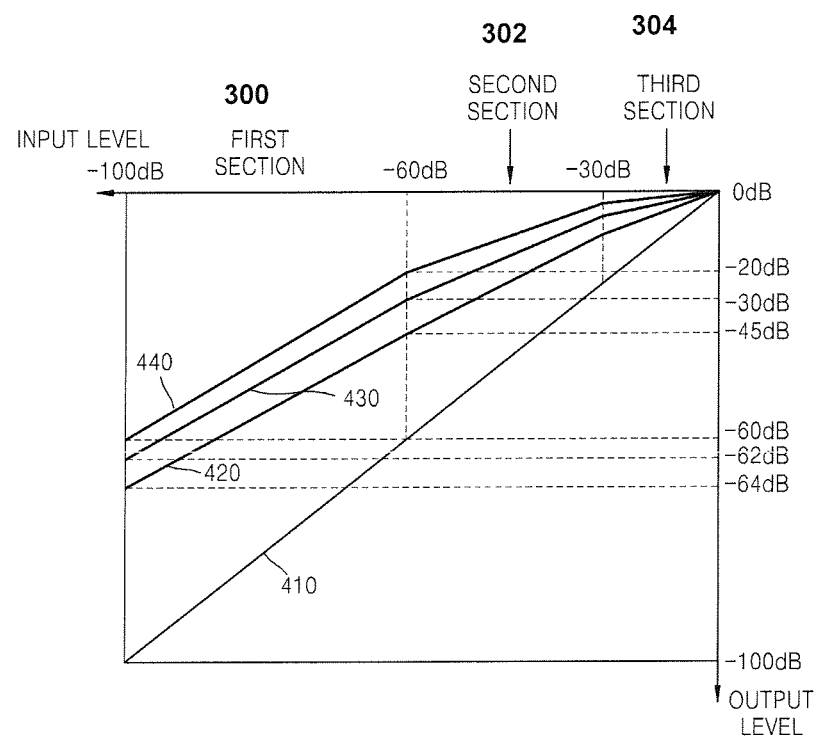
FIG. 4 is a graph illustrating a first control mode according to an embodiment of the present invention.

FIG. 4 is a graph illustrating the first control mode according to an embodiment of the present invention. Referring to FIG. 4, input levels and corresponding output levels are illustrated in the first control mode. As noted above, the control mode determiner 130 applies the first control mode when an average value of the input levels is less than the first threshold.

At a line 410, the input levels are output as corresponding output levels without being controlled by the control mode determiner 140. For example, if an input level is −60 db, a corresponding output level is also −60 db at the line 410. The input level and the corresponding output level have the same dynamic range between 0 db and −100 db.

In contrast to the line 410, at the lines 420, 430, and 440, the control mode determiner 140 controls the input levels and the output level determiner 150 determines the corresponding output levels based on the controlled input levels. The input levels are divided into the first, second, and third sections, 300, 302, and 304, and level inclinations differ from each other in the three sections 300, 302, and 304. The graphs 420, 430, and 440 show a high level, a middle level, and a low level of voltage supplied by the audio device, respectively. Line 420 will be representatively described to describe each of lines 420, 430, and 440.

At the line 420, two level inclinations which are lower than another level inclination used to control the input level of the audio signal 210 included in the first section 300 are used to control the input levels of the audio signal 210 included in the second and third sections and to determine the corresponding output levels. In other words, in the first control mode, the level inclination of the line 420 applied in the first section 300 has a higher slope than the level inclinations of the line 420 applied in the second section 302 and the third section 304, as shown in FIG. 4.

The input level of the audio signal 210 included in the first section 300 is controlled using a relatively high level inclination since a recording level of the audio signal 210 is low in the first control mode, the first section assumed to have many audio signals 210. If a very low level inclination was applied to the first section 300, the very low level inclination would greatly reduce a dynamic range of output levels of audio signals 210, which would cause damage to the quality of the audio signal 210. Accordingly, a relatively high level inclination is used.

Figure 5:
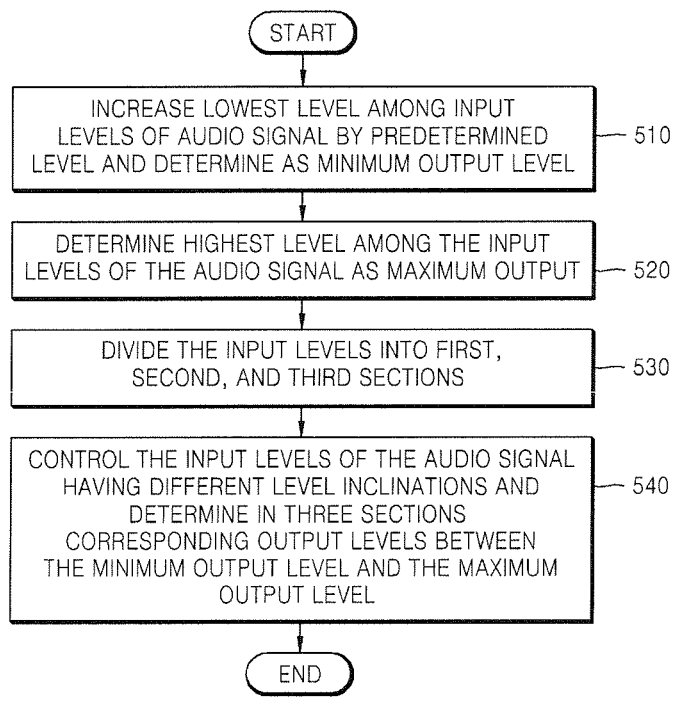
FIG. 5 is a flowchart illustrating the operation of an output level determiner according to an embodiment of the present invention.

The operation of the output level determiner 150 to obtain the output level as illustrated by the line 420 of FIG. 4 will now be described with reference to FIG. 5. FIG. 5 is a flowchart illustrating the operation of the output level determiner 150 according to an embodiment of the present invention. Referring to FIG. 5, at operation 510, the output level determiner 150 increases a lowest level among input levels of the audio signal 210 by a predetermined level and determines the lowest level to be a minimum output level.

At the line 420, the output level determiner 150 increases an input level of −100 db by 36 db and determines, or sets, the increased input level as the minimum output level. At operation 520, the output level determiner 150 determines, or sets, a highest level among the input levels of the audio signal 210 as a maximum output level. At the line 420, the output level determiner 150 determines the highest level of 0 db as the maximum output level.

At operation 530, the output level determiner 150 divides the input levels into the first, second, and third sections 300, 302, and 304. As shown in FIG. 4, at the line 420, the output level determiner 150 divides the input levels into the first, second, and third sections 300, 302, and 304. However, aspects of the present invention are not limited thereto, and the output level determiner 150 can divide the input levels into more or less than three sections.

At operation 540, the output level determiner 150 controls the input levels of the audio signal 210 in the three sections 300, 302, and 304 which have different level inclinations from each other, and determines corresponding output levels between the minimum output level and the maximum output level. At the line 420, as described above, the output level determiner 150 controls the input levels of the audio signal 210 included in the second and third sections 302 and 304 using a level inclination that is lower than another level inclination used to control the input level of the audio signal 210 included in the first section 300, and determines the corresponding output levels based on the level inclinations.

The corresponding output levels at the line 420 become higher than output levels that are determined after input levels which are not controlled, i.e., input levels at the line 410. For example, at the line 420, if an input level is −60 db, the corresponding output level is determined to be −45 db. However, as illustrated in FIG. 4, a dynamic range of 100 db of the output levels that are determined after the input levels are not controlled at the line 410 is broader than the dynamic range of 60 db of the output level determined after the input levels are controlled at the line 420.

The second and third sections 302 and 304 can have the same level inclinations. Alternatively, the input levels of the audio signal 210 included in the third section 304 can be controlled and then output as the corresponding output levels using a level inclination which is lower than the level inclination of the second section 302. Moreover, the input level of the audio signal 210 included in the third section 304 can be controlled and then output as the corresponding output level using a level inclination which is higher than the level inclination of the second section 302.

At lines 430 and 440, the output levels are controlled and determined as final output levels based on the level of voltage supplied by the audio device and detected by the level detector 110. The graphs 420, 430, and 440 represent a high level, a middle level, and a low level of voltage supplied by the audio device, respectively. The output levels increase by a predetermined level in order to increase the output levels to compensate for the reduction of the audio signal caused by a decrease in a voltage level supplied by the audio device, for example, when a battery gets low.

For example, the output level determiner 150 increases the output levels determined according to the line 420 by the predetermined level, and determines, or sets, the increased output levels as the final output levels 430 and 440 when the voltage drops from a high level to a middle level and a low level, respectively. Although the minimum output levels increase by 2 db or 4 db, the output levels of the audio signal 210 do not uniformly increase by 2 db or 4 db, but differ from each other according to the three sections 300, 302, and 304.

Figure 6:
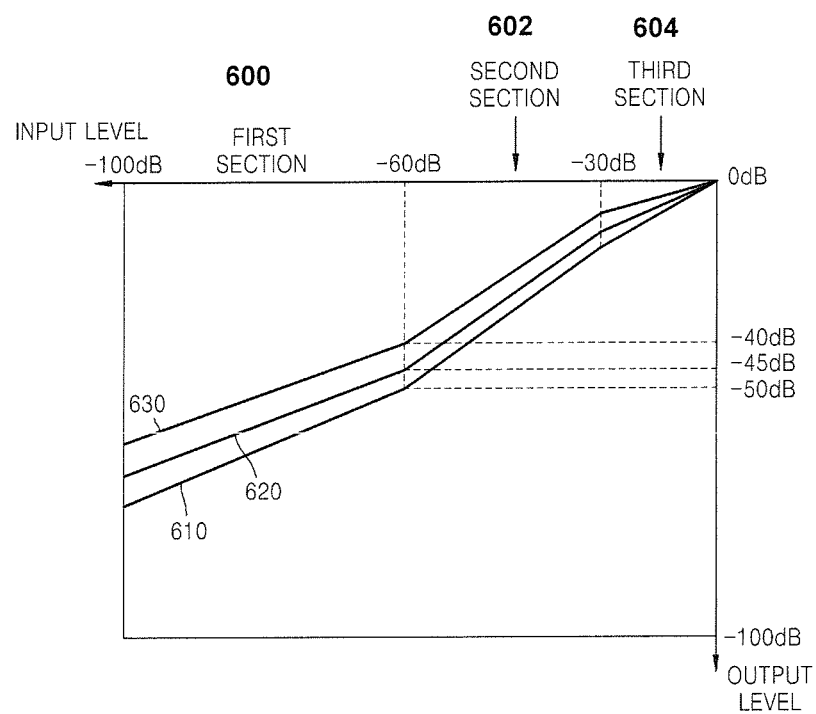
FIG. 6 is a graph illustrating a second control mode according to an embodiment of the present invention.

FIG. 6 is a graph illustrating the second control mode according to an embodiment of the present invention. Referring to FIG. 6, input levels and corresponding output levels are illustrated in the second control mode. The control mode determiner applies the second control mode to the audio signal 210 when an average value of the input levels is determined to be between the first threshold and the second threshold.

The output level determiner 150 controls the input levels of the audio signal 210 included in the first and third sections 600 and 604 using two level inclinations which are lower than another level inclination used in the second section 602 and determines the corresponding output levels in the second control mode. Since the majority of the audio signal is included in the second section when the second control mode is used, a low level inclination of the second section 602 reduces a dynamic range of the audio signal 210 included in the second section 210, which causes damage to the quality of the audio signal 210. Accordingly, a relatively high level inclination is used in the second section 602. Furthermore, the level inclinations used in the first section 600 and the third section 604 may be equal to each other, or one may be higher than the other.

Lines 610, 620, and 630 correspond to lines 420, 430, and 440 shown in FIG. 4, and other descriptions are the same as the description of the first control mode described above with reference to FIG. 4. Thus, descriptions thereof are not repeated.

Figure 7:
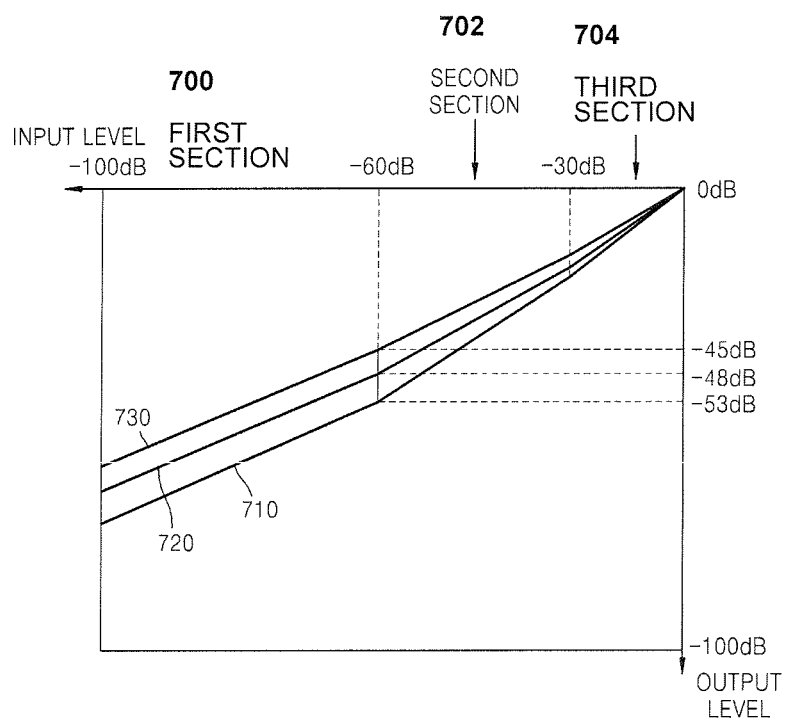
FIG. 7 is a graph illustrating a third control mode according to an embodiment of the present invention.

FIG. 7 is a graph illustrating the third control mode according to an embodiment of the present invention. Referring to FIG. 7, input levels and corresponding output levels are illustrated in the third control mode. The control mode determiner 130 applies the third control mode when an average value of the input levels of the audio signal 210 is more than the second threshold.

The output level determiner 150 controls the input levels of the audio signal 210 included in the first and second sections 700 and 702 using two level inclinations which are lower than another level inclination used in the third section 704 and determines the corresponding output levels in. Since the majority of the audio signal 210 is included in the third section 704, a low level inclination of the third section 704 reduces a dynamic range of the audio signal 210 in the third section 704, which causes damage to the quality of the audio signal 210. Accordingly, a high level inclination is applied to the third section 704.

The first and second sections 700 and 702 shown in FIG. 7 can have the same level inclinations. Alternatively, as shown in FIG. 7, the input levels of the audio signal included in the first section 700 can be controlled and determined as the corresponding output levels using a level inclination which is lower than a level inclination of the second section 702. Moreover, the level inclination in the first section 700 may be higher than the level inclination of the second section 702.

Lines 710, 720 and 730 correspond to lines 410, 420, and 430 shown in FIG. 4, and other descriptions of the third control mode are the same as the description of the first control mode described above with reference to FIG. 4. Thus, descriptions thereof are not repeated.

Meanwhile, the output level determiner 150 controls the input levels based on a database (not shown) which stores the output levels that are determined after the input levels of the audio signal 210 are controlled according to the control modes, and determines the output levels based on the stored input levels. In more detail, the optimum output levels are calculated by conducting a test or the like and are stored in the database. If the control modes are determined according to the input levels of the audio signal 210, the output level determiner 150 controls the input levels based on the output levels stored in the database so that the audio device outputs the audio signal 210 having the stored output levels.

Figure 8:
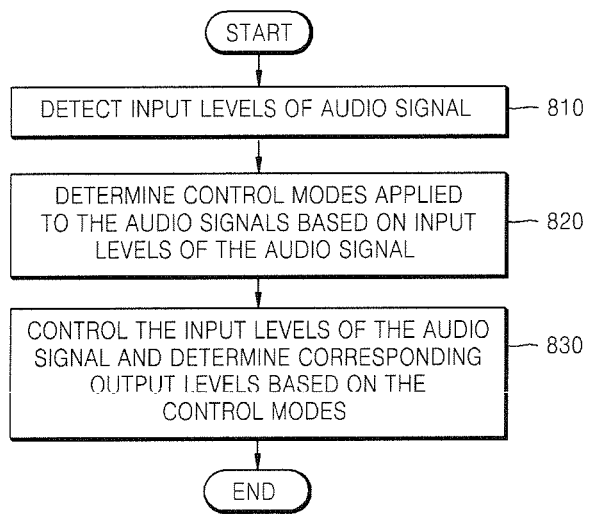
FIG. 8 is a flowchart illustrating an audio signal output level control method used in a portable audio device according to an embodiment of the present invention.

FIG. 8 is a flowchart illustrating an audio signal output level control method used in an audio device according to an embodiment of the present invention. Referring to FIG. 8, at operation 810, the input levels of the audio signal 210 are detected. At this time, the level detector 110 detects a level of voltage supplied by the audio device. While the audio device may be portable, it is understood that aspects of the present invention may also be applied to non-portable audio devices as well.

At operation 820, control modes applied to the audio signal 210 are determined based on the input levels of the audio signal. When the audio signal 210 is divided into a plurality of sections, such as the first, second, and third sections 300, 302, and 304 (FIG. 3) according to a predetermined period of time or a predetermined number of samples, different control modes are applied to the audio signal according to the sections.

At operation 830, the input levels of the audio signal 210 are controlled and corresponding output levels are determined based on the control modes. The output levels that are determined after the input levels are controlled are higher than those determined after the input levels are not controlled, but have a dynamic range which is narrower than that of the output levels which are not controlled. Therefore, in order to compensate for the narrow dynamic range of the output levels determined after the input levels are controlled, level inclinations to control the input levels vary according to the sections of the input levels based on the control modes. For example, as shown in FIG. 4, since the first control mode is used when the average input level of the audio signal 210 is at a low level, the majority of the audio signal 210 is at a low level, and the first section 300 is set to have the highest level inclination to supply the greatest boost to the portion of the audio signal 210 in the first section 300, thereby increasing the output level of the majority of the audio signal 210.

Aspects of the present invention may be embodied on a computer-readable recording medium encoded with a computer readable program with processing instructions. Computer-readable recording media include many kinds of recording device that store computer system-readable data. ROM, RAM, CD-ROM, magnetic tape, floppy disc, optical data storage, etc. are used as computer-readable recording media. The computer-readable recording media can also be realized in the form of a carrier wave (e.g., transmission through the Internet).

Aspects of the present invention detect input levels of an audio signal 210, determine control modes applied to the audio signal 210 based on the input levels of the audio signal 210, control the input levels of the audio signal 210 according to the control modes, and determine output levels corresponding to the input levels. In doing so, aspects of the present invention provide an apparatus and method to output an audio signal 210 that is input at a low volume level, and/or an audio signal 210 that is to be output at a low level due to a limited battery voltage level, at a high level. Additionally, aspects of the present invention are not limited to audio signals 210, but may also be applied to other types of signals, such as video signals or data transmission signals of various types. For example, an aspect of the present invention may be implemented to boost a brightness of a video signal using the same methods as described above with reference to the audio signal 210.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An audio signal output level control method to be used in an audio device, the method comprising:
    detecting input levels of an audio signal;
    setting a plurality of thresholds for the audio signal, each of the plurality of thresholds being different from each other with respect to the detected input levels of the audio signal and defining a plurality of sections of the audio signal;
    determining a section from among the plurality of sections in which a calculated average value of the input level is located;
    determining a control mode from among a plurality of control modes to be applied to the audio signal based on a calculated average value of the input levels;
    controlling the input levels of the audio signal according to the determined control mode; and
    determining output levels corresponding to the controlled input levels,
    wherein each of the control modes has a plurality of level inclinations used to control the input levels, and
    wherein each of the plurality of level inclinations corresponds to an increase of each output level according to an increase of each of the input levels, and
    wherein, the control mode has a level inclination, from among the plurality of inclinations, which has the highest inclination in comparison to the other level inclinations applied to the input levels in the other sections, and is applied to the input levels in the determined section.

2. The method of claim 1, wherein the determining of the control modes comprises:
    dividing the audio signal into the plurality of processing sections based on a predetermined period of time or a predetermined number of samples; and
    calculating an average value of the input levels of the audio signal included in the processing sections for each of the processing sections,
    wherein the control mode to be applied to the audio signal included in each of the processing sections are determined based on the average values of the input levels in each of the processing sections.

3. The method of claim 2, wherein the determining of the output levels further comprises:
    increasing a lowest input level among the input levels of the audio signal by a predetermined level;
    determining the increased input level as a minimum output level;
    determining a highest input level among the input levels as a maximum output level; and
    determining the output levels between the minimum output level and the maximum output level using the level inclinations obtained by determining differences between increases in the input levels and corresponding increases in the output levels.

4. The method of claim 3, wherein the determining of the output levels further comprises:
    dividing the input levels into a first section where the input levels are less than a first threshold, a second section where the input levels are between the first threshold and a second threshold, and a third section where the input levels are more than the second threshold;
    controlling the input levels included in each of the processing sections using the plurality of level inclinations; and
    determining the output levels based on the controlled input levels.

5. The method of claim 4, wherein the input levels of the audio signal included in the second section and the third section are respectively controlled using two of the level inclinations which are lower than another of the level inclinations used to control the input levels of the audio signal included in the first section and then output as the output levels, based on a first control mode applied to the audio signal when the average value of the input levels is less than the first threshold.

6. The method of claim 5, wherein the input levels of the audio signal included in the third section are controlled using one of the two level inclinations which is lower than the other of the two level inclinations used to control the input levels of the audio signal included in the second section, and then output as the output levels.

7. The method of claim 4, wherein the input levels of the audio signal included in the first section and the third section are respectively controlled using two of the level inclinations which are lower than another of the level inclinations used to control the input levels of the audio signal included in the second section and then output as the output levels, based on a second control mode applied to the audio signal when the average value of the input levels is between the first threshold and the second threshold.

8. The method of claim 4, wherein the input levels of the audio signal included in the first section and the second section are respectively controlled using two of the level inclinations which are lower than another of the level inclinations used to control the input levels of the audio signal included in the third section and then output as the output levels, based on a third control mode applied to the audio signal when the average value of the input levels is more than the second threshold.

9. The method of claim 8, wherein the input levels of the audio signal included in the first section are controlled using one of the two level inclinations which is lower than the other of the two level inclinations used to control the input levels of the audio signal included in the second section, and then output as the output levels.

10. The method of claim 1, wherein the detecting of the input levels of the audio signal comprises detecting a voltage level supplied by the audio device, and the determining of the output levels comprises:
increasing the output levels by a predetermined level based on the detected voltage; and
determining the output levels as final output levels.

11. The method of claim 1, wherein the determining of the output levels comprises controlling the input levels using a database which stores the output levels which are determined after the input levels of the audio signal are controlled according to the control modes; and
determining the output levels based on the stored output levels.

12. The method of claim 1, wherein the audio device comprises one of an MP3 player and a cell phone.

13. A non-transitory computer readable recording medium encoded with a computer readable program with processing instructions for executing the method of claim 1.

14. An audio signal output level control apparatus of an audio device, implemented as hardware, the apparatus comprising:
a level detector to detect input levels of an audio signal;
an output level determiner to set a plurality of thresholds for the audio signal, each of the plurality of thresholds being different from each other with respect to the detected input levels of the audio signal and defining a plurality of sections of the audio signal; and
a control mode determiner to determine a section from among the plurality of sections in which a calculated average value of the input levels is located and to determine a control mode from among a plurality of control modes to be applied to the audio signal based on the calculated average value of the input levels;

wherein the output level determiner controls the input levels of the audio signal according to the control mode and to determine output levels corresponding to the controlled input levels,
wherein each of the control modes has a plurality of level inclinations used to control the input levels,
wherein each of the plurality of level inclinations corresponds to an increase of each output level according to an increase of each of the input levels, and
wherein, the control mode has a level inclination, from among the plurality of inclinations, which has the highest inclination in comparison to the other level inclinations applied to the input levels in the other sections, and is applied to the input levels in the determined section.

15. The apparatus of claim 14, further comprising:
a section divider to divide the audio signal into the plurality of processing sections according to a predetermined period of time or a predetermined number of samples; and
an average calculator to calculate an average value of the input levels of the audio signal included in each of the processing sections,
wherein the control mode determiner determines the control mode applied to the audio signal included in each of the processing sections based on the average values of the input levels in each of the processing sections.

16. The apparatus of claim 15, wherein the output level determiner increases a lowest input level among the input levels of the audio signal by a predetermined level, determines the increased input level as a minimum output level, determines a highest input level as a maximum output level, and determines the output levels between the minimum output level and the maximum output level using the level inclinations corresponding to differences between an increase in the input levels and a corresponding increase of the output levels.

17. The apparatus of claim 16, wherein the output level determiner divides the input levels into a first section where the input levels are less than a first threshold, a second section where the input levels are between the first threshold and a second threshold, and a third section where the input levels are more than the second threshold, controls the input levels of the audio signal included in each of the first, second and third sections using the plurality level inclinations, and determines the output levels based on the controlled input levels.

18. The apparatus of claim 17, wherein the output level determiner respectively controls the input levels of the audio signal included in the second section and the third section using two of the level inclinations which are lower than another of the level inclinations used to control the input levels of the audio signal included in the first section and determines the controlled input levels as the output levels, based on a first control mode applied to the audio signal when the average value of the input levels is less than the first threshold.

19. The apparatus of claim 18, wherein the output level determiner controls the input levels of the audio signal included in the third section using one of the two level inclinations which is lower than the other of the two level inclinations used to control the input levels of the audio signal included in the second section and determines the controlled input levels as the output levels.

20. The apparatus of claim 17, wherein the output level determiner respectively controls the input levels of the audio signal included in the first section and the third section using two of the level inclinations which are lower than another of the level inclinations used to control the input levels of the audio signal included in the second section and determines the controlled input levels as the output levels, based on a second control mode applied to the audio signal when the average value of the input levels is between the first threshold and the second threshold.

21. The apparatus of claim 17, wherein the output level determiner respectively controls the input levels of the audio signal included in the first section and the second section using two of the level inclinations which are lower than another of the level inclinations used to control the input levels of the audio signal included in the third section and determines the controlled input levels as the output levels, based on a third control mode applied to the audio signal when the average value of the input levels is more than the second threshold.

22. The apparatus of claim 21, wherein the output level determiner controls the input levels of the audio signal included in the first section using one of the two level inclinations which is lower than the other of the two level inclinations used to control the input levels of the audio signal included in the second section, and determines the controlled input levels as the output levels.

23. The apparatus of claim 16, wherein the level detector detects the input levels of the audio signal and a level of voltage supplied by the audio device, and the output level determiner increases the output levels by a predetermined level based on the detected level of voltage, and determines the output levels as final output levels.

24. The apparatus of claim 14, wherein the output level determiner controls the input levels using a database which stores the output levels determined after the input levels of the audio signal are controlled according to the control modes and determines the output levels based on the stored output levels.

25. The apparatus of claim 14, wherein the audio device comprises one of an MP3 player and a cell phone.

26. A method to control a signal output, the method comprising:
   calculating an average intensity of detected input levels of a signal;
   setting a plurality of thresholds for the signal, each of the plurality of thresholds being different from each other with respect to the detected input levels of the signal and defining a plurality of processing sections of the signal;
   determining a section from among the plurality of sections in which the calculated average intensity is located;
   applying a control mode from among a plurality of control modes to the detected input levels based on the calculated average intensity; and
   outputting output levels based on the controlled input levels,
   wherein each of the control modes has a plurality of level inclinations used to control the input levels,
   wherein each of the plurality of level inclinations corresponds to an increase of each output level according to an increase of each of the input levels, and
   wherein, the control mode has a level inclination, from among the plurality of inclinations, which has the highest inclination in comparison to the other level inclinations applied to the input levels in the other sections, and is applied to the input levels in the determined section.

27. The method of claim 26, wherein the signal comprises an audio signal.

28. The method of claim 26, wherein the applying of the control mode comprises:
   determining the control mode to apply to the input levels based on a location of the calculated average intensity in comparison to the plurality of thresholds.

29. The method of claim 28, wherein the defining of the plurality of processing sections, and the applying of the control mode further comprises:
   applying the plurality of level inclinations to the input levels based on locations of the input levels in comparison to the plurality of processing sections, wherein the plurality of level inclination are used to increase the output levels in relation to the corresponding input levels, and a level inclination from among the plurality of inclinations applied to the input levels in a section from among the plurality of processing sections having the calculated average intensity has the highest inclination in comparison to the other level inclinations applied to the input levels in the other sections.

30. The method of claim 29, wherein the outputting of the output levels comprises:
   increasing a lowest input level among the input levels by a predetermined level;
   setting the increased input level as a minimum output level; and
   outputting the output levels by increasing each of the input levels from the minimum output level by an amount of the corresponding level inclinations.

31. The method of claim 30, further comprising detecting a voltage level supplied by a device supplying the signal, wherein the outputting of the output levels comprises increasing the output levels by a predetermined level based on the detected voltage.

32. The method of claim 31, wherein the device comprises one of an MP3 player and a cell phone.

33. An apparatus, implemented as hardware, to control a signal output, the apparatus comprising:
   an average calculator to calculate an average intensity of detected input levels of a signal;
   an output level determiner to set a plurality of thresholds for the signal, each of the plurality of thresholds being different from each other with respect to the detected input levels of the signal and defining a plurality of sections of the signal;
   a control mode determiner to determine a section from among the plurality of sections in which a calculated average value of the input levels is located and to apply a control mode from among a plurality of control modes to the detected input levels based on the calculated average intensity;
   wherein the output level determiner controls the input levels according to the applied control mode and to determine output levels corresponding to the controlled input levels,
   wherein each of the control modes has a plurality of level inclination used to control the input levels,
   wherein each of the plurality of level inclinations corresponds to an increase of each output level according to an increase of each of the input levels, and
   wherein, the control mode has a level inclination, from among the plurality of inclinations, which has the highest inclination in comparison to the other level inclinations applied to the input levels in the other sections, and is applied to the input levels in the determined section.

34. The apparatus of claim 33, wherein the signal comprises an audio signal.

35. The apparatus of claim 33, wherein the control mode determiner determines the control mode to apply to the input levels based on a location of the calculated average intensity in comparison to the plurality of thresholds.

36. The apparatus of claim 35, wherein the output level determiner applies the plurality of level inclinations to the input levels based on locations of the input levels in comparison to the sections, wherein the plurality of level inclinations are used to increase the output levels in relation to the corresponding input levels, and a level inclination from among the plurality of level inclinations applied to the input levels in the section having the calculated average intensity has the highest inclination in comparison to the other level inclinations applied to the input levels in the other sections.

37. The apparatus of claim 36, wherein the output level determiner increases a lowest input level among the input levels by a predetermined level, sets the increased input level as a minimum output level, and outputs the output levels by increasing each of the input levels from the minimum output level by an amount of the corresponding level inclinations.

38. The apparatus of claim 37, further comprising a level detector to detect the input levels, wherein the level detector detects a voltage level supplied by a device supplying the signal, and the outputting of the output levels comprises increasing the output levels by a predetermined level based on the detected voltage.

39. The apparatus of claim 38, wherein the device comprises one of an MP3 player and a cell phone.

* * * * *